United States Patent [19]

Murakami

[11] Patent Number: 5,336,910
[45] Date of Patent: Aug. 9, 1994

[54] CHARGE COUPLED DEVICE OF HIGH SENSITIVITY AND HIGH INTEGRATION

[75] Inventor: Norio Murakami, Tokyo, Japan

[73] Assignee: Oki Electric Industry Co., Ltd., Tokyo, Japan

[21] Appl. No.: 7,923

[22] Filed: Jan. 25, 1993

[30] Foreign Application Priority Data

Jan. 27, 1992 [JP] Japan .................. 4-011880

[51] Int. Cl.[5] ............................................ H01L 29/78
[52] U.S. Cl. .................... 257/239; 257/221; 257/235; 257/237; 257/248; 377/60; 377/62
[58] Field of Search ............ 257/215, 218, 219, 221, 257/235, 236, 237, 239, 246, 248, 250; 377/58, 60, 61, 62, 63

[56] References Cited

U.S. PATENT DOCUMENTS 4,528,684  7/1985  Iida et al. ................. 257/239

FOREIGN PATENT DOCUMENTS 56-148867  11/1981  Japan ...................... 257/221
61-220467   9/1986  Japan .
3-19349     1/1991  Japan .
2197986     6/1988  United Kingdom ......... 257/221

*Primary Examiner*—Ngan Van Ngo
*Attorney, Agent, or Firm*—Panitch Schwarze Jacobs & Nadel

[57] ABSTRACT

A charge coupled device according to the present invention, having an output terminal, for detecting an electric charge and for outputting a detection signal corresponding to the electric charge from the output terminal, comprises a semiconductor substrate having a main surface, further having a first, second and third regions in the main surface, both the first and second regions defining the third region therebetween, a charge supply formed in the vicinity of the first region, for supplying the electric charge to the first region, a first impurity formed in the first region, for transferring the electric charge to the third region, a floating gate electrode overlying the third region, coupled to the output terminal, for detecting the electric charge and outputting the detection signal corresponding to the electric charge from the output terminal in a first condition, for transferring the electric charge to the second region in a second condition, a transfer electrode overlying the second region, applied a control signal having a first or second logic levels thereto, for controlling to receive the electric charge at the time of the control signal having the first logic level, the control signal having the first logic level at the time of the floating gate electrode being in the first condition, a second impurity formed in a fourth region, the fourth region disposed in the second region and in the vicinity of the third region. Accordingly, the present invention can provide a charge coupled device of high sensitivity and high integration.

5 Claims, 2 Drawing Sheets

CHARGE COUPLED DEVICE OF HIGH SENSITIVITY AND HIGH INTEGRATION

BACKGROUND OF THE INVENTION

1. Field of Invention:

The present invention relates to a charge coupled device (referred to CCD hereinafter), particularly to the structure of an output portion thereof for detecting and outputting a signal electric charge.

2. Description of the Related Art

There are a Floating Diffusion method (referred to FD method hereinafter) and a Floating Gate method (referred to FG method hereinafter) in the signal output methods of the CCD. The FD method detects the change of electric potential which is generated when a signal electric charge is applied to a reverse bias on a junction capacitance. The FG method detects the change of electric potential of a MOS gate electrode when a signal electric charge is applied to the capacitance when the floating MOS gate electrode is floating.

The FG method generates little noise at a detecting portion for detecting the signal electric charge. Moreover, the FG method can detect the signal electric charge without deteriorating the same, so that the FG method can reuse the detected signal. Accordingly, the FG method is used as a very effective means when a plurality of signal detections are required using a same signal. For example, the FG method is used in a CCD camera element which needs a high S/N ratio (signal/-noise ratio), a CCD delay line, or a CCD filter element.

Such a CCD is disclosed, for example, in the Japanese Laid-Open Patent Publication No. 3-19349, published on Jan. 28, 1991 or the Japanese Laid-Open Patent Publication No. 61-220467, published on Sep. 30, 1986.

SUMMARY OF THE INVENTION

It is an object of the present invention to provide a CCD of high sensitivity and high degree of integration.

In order to achieve the above object, the CCD according to the present invention, having an output terminal, for detecting an electric charge and for outputting a detection signal corresponding to the electric charge from the output terminal, comprises a semiconductor substrate having a main surface, further having first, second and third regions in the main surface, both the first and second regions defining the third region therebetween; a charge supply formed in the vicinity of the first region, for supplying the electric charge to the first region; a first impurity formed in the first region, for transferring the electric charge to the third region; a floating gate electrode overlying the third region, coupled to the output terminal, for detecting the electric charge and outputting the detection signal corresponding to the electric charge from the output terminal in a first condition, for transferring the electric charge to the second region in a second condition; a transfer electrode overlying the second region, applied a control signal having a first or second logic level thereto, for receiving the electric charge at the time of the control signal having the first logic level, the control signal having the first logic level at the time of the floating gate electrode being in the first condition; a second impurity formed in a fourth region, the fourth region disposed in the second region and in the vicinity of the third region.

As described above, since the FG electrode is formed between the p-type impurity and the transfer gate electrode having two kinds of channel potential thereunder, according to the present invention, it is possible to reduce the parasitic capacitance between the FG electrode and the gate electrode adjacent thereto, and furthermore it is possible to control the discharge from the FG electrode and the transfer to the next stage CCD of the electric charge by a transfer gate electrode alone. Accordingly, the present invention can provide a CCD of high sensitivity and high integration.

DESCRIPTION OF THE PREFERRED EMBODIMENTS

Figure 1:
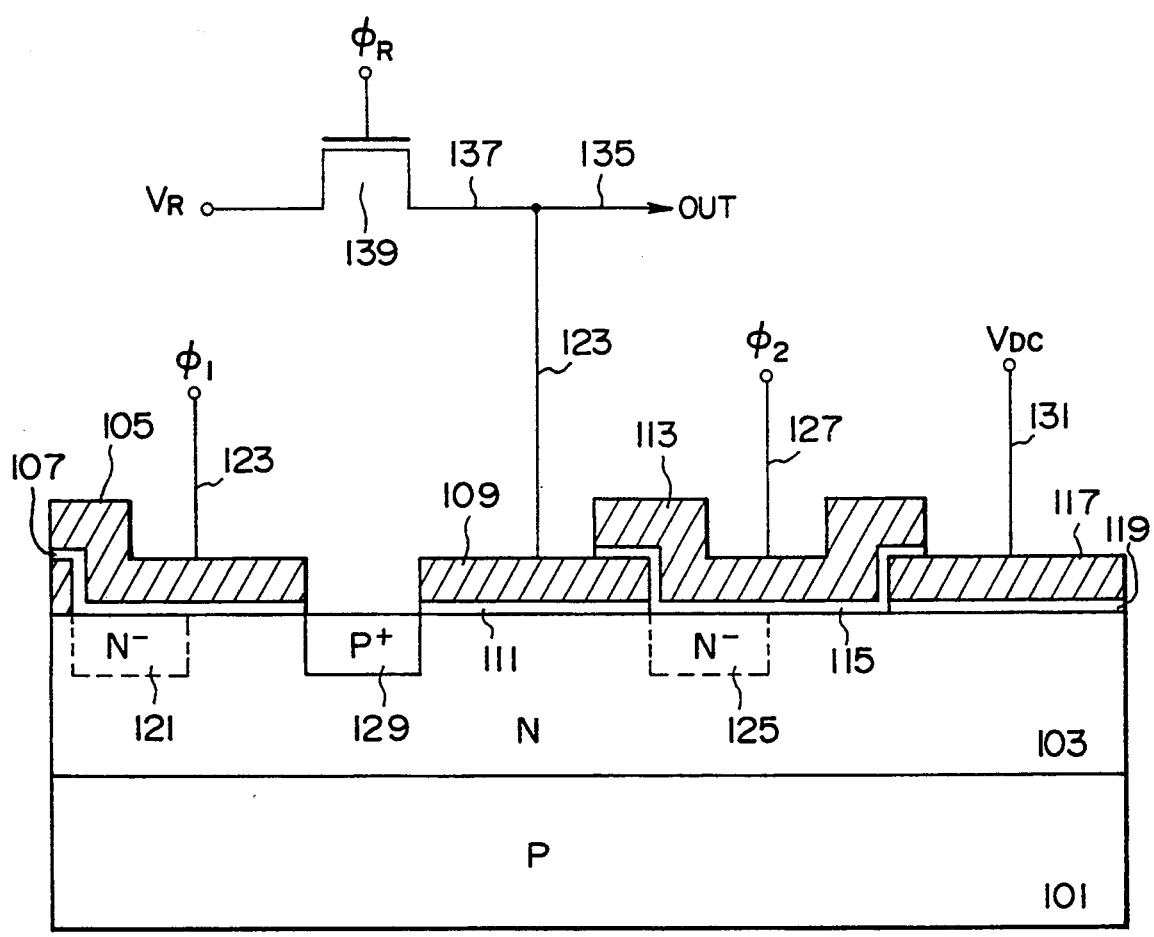
FIG. 1 is a cross-sectional view showing the signal output portion of a CCD according to the present invention.

FIG. 1 is a cross-sectional view showing the signal output portion of a CCD according to the present invention.

The CCD comprises a p-type semiconductor substrate 101 and a n-type impurity layer 103 formed thereon. The p-type semiconductor substrate 101 can be also formed of a p-type well layer.

In a predetermined region of the n-type impurity layer 103, there are formed a first transfer gate electrode 105 through a gate oxide film 107, a Floating Gate electrode (referred to FG electrode hereinafter) 109 through a gate oxide film 111, a second transfer gate electrode 113 through a gate oxide film 115 and an output gate electrode 117 through a gate oxide film 119 respectively.

In the n-type impurity layer 103 under the first transfer gate electrode 105, a n-type impurity layer 121 which is lower in impurity density than the n-type impurity layer 103 is selectively formed so as to form two kinds of channel potentials. A first clock signal $\phi_1$ is applied to the first transfer gate electrode 105 by way of a signal line 123. The first clock signal $\phi_1$ controls the transfer of electric charge.

In the n-type impurity layer 103 under the second transfer gate electrode 113, a n-type impurity layer 125 which is lower in impurity density than the n-type impurity layer 103 is selectively formed so as to form two kinds of channel potentials. A second clock signal $\phi_2$ is applied to the second transfer gate electrode 113 by way of a signal line 127. The second clock signal $\phi_2$ controls the transfer of electric charge.

A p-type impurity layer 129 which is higher in impurity density than the p-type semiconductor substrate 101 is formed on the surface of the n-type impurity layer 103 between the first transfer gate electrode 105 and the FG electrode 109 and in the vicinity thereof. The p-type impurity layer 129 determines the transfer direction of an electric charge e−.

In this case, the FG electrode 109 and the output gate electrode 117 are formed of MOS gate electrodes which are formed in the first layer in the semiconductor process. The first transfer gate electrode 105 and the second transfer gate electrode 113 are composed of MOS gate electrodes which are formed in the second layer in the semiconductor process.

The output gate electrode 117 is connected to a constant voltage power supply for supplying a constant voltage $V_{DC}$ by way of a voltage supply line 131.

The FG electrode 109 is connected to an output signal line 135 for outputting an output signal OUT and a reset signal line 137 by way of a line 123. The first electrode of a reset transistor 139 which is a MOS transistor is connected to the reset signal line 137. Furthermore, the second electrode of the reset transistor 139 is connected to a reference voltage supply for supplying a reference voltage $V_R$ and a reset signal $\phi_R$ is applied to the gate electrode thereof. The reset signal $\phi_R$ controls the potential under the FG electrode 109 by resetting.

Figure 2:
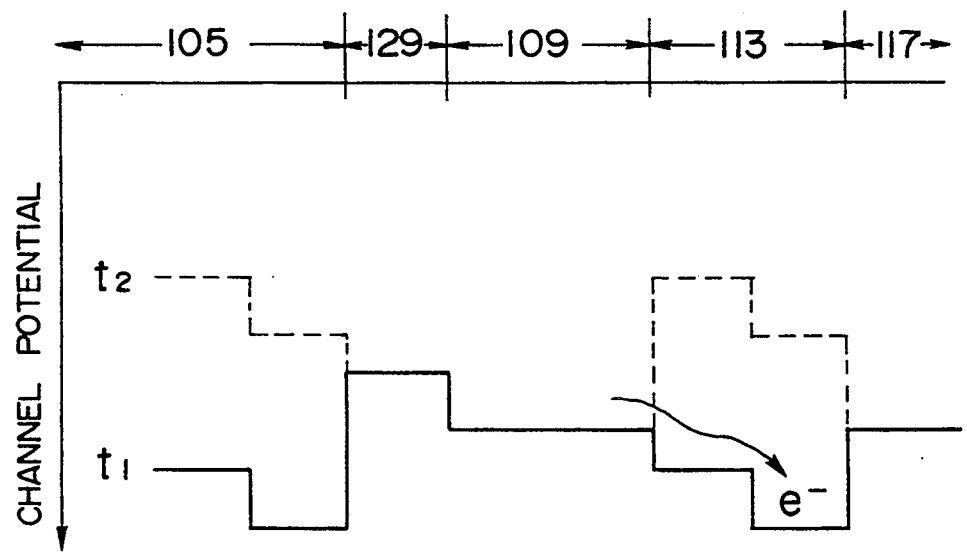
FIG. 2 is a diagram showing the distribution of electric potential formed under each electrode in the signal output portion of the CCD illustrated in FIG. 1.

FIG. 2 shows the distribution of respective channel potentials under the first transfer gate electrode 105, the p-type impurity layer 129, the FG electrode 109, the second transfer gate electrode 113 and the output gate electrode 117 of the CCD illustrated in FIG. 1. In FIG. 2, the solid line indicates the distribution of potential at the time $t_1$, while the broken line indicates that at the time $t_2$. In this figure, the axis of ordinates represents the channel potential, which is increased in the direction of the arrow (downward). In this case, the electric charge $e^-$ moves from a low potential position toward a high potential position.

Figure 3:
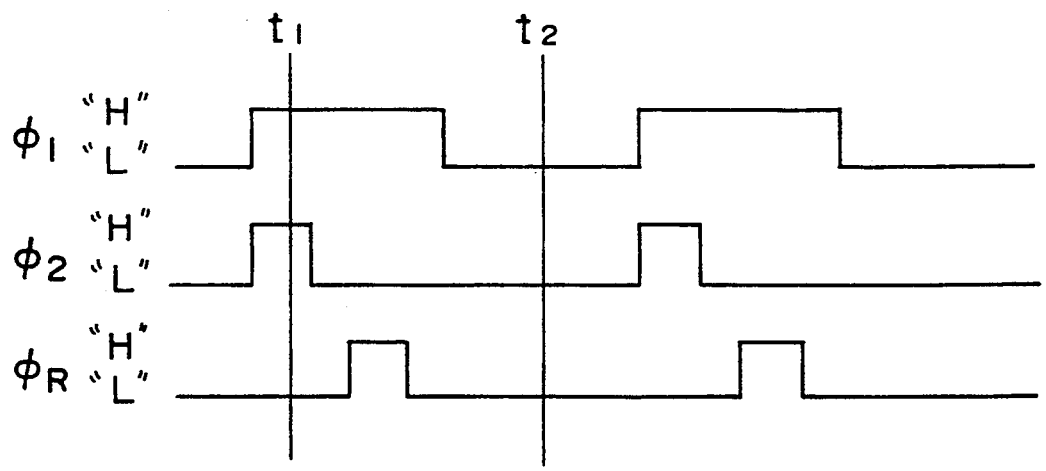
FIG. 3 is a waveform diagram showing the waveforms of a first clock signal $\phi_1$, a second clock signal $\phi_2$ and a reset signal $\phi_R$.

FIG. 3 is a signal waveform diagram showing the driving timing of the first clock signal $\phi_1$, the second clock signal $\phi_2$ and the reset signal $\phi_R$.

The operation of the CCD according to the present invention will be described hereinafter with reference to FIGS. 2 and 3.

At first, when the clock signal $\phi_1$ and the second clock signal $\phi_2$ is on "H" level and the reset signal $\phi_R$ is on "L" level at the time $t_1$, the potential under each electrode is indicated by the solid line in FIG. 2, so that the electric charge $e^-$ under the FG electrode 109 moves to the position under the second transfer electrode 113. Thereafter when the second clock signal $\phi_2$ changes to "L" level, the electric charge $e^-$ under the second transfer electrode 113 is transferred to the next stage CCD, not shown, via the output gate electrode 117. And when the reset signal $\phi_R$ changes to "H" level, the reset transistor 139 is turned ON, so that the reference voltage $V_R$ is applied to the FG electrode 109 via the reset signal line 137 and the line 123. Thus the potential of the FG electrode 109 is set to a given reset potential. At that time, the reset signal $\phi_R$ causes no problem in its operation even if it changes to "H" level at the same time as the second clock signal $\phi_2$ changes to "L" level or before the second clock signal $\phi_2$ changes to "L" level. When the reset signal $\phi_R$ changes to "L" level, the reset transistor 139 is turned OFF so that the FG electrode 109 is in a floating state.

When the first clock signal $\phi_1$ changes to "L" level at the time $t_2$, the potential under each electrode becomes that indicated by the broken line in FIG. 2, so that the electric charge $e^-$ under the first transfer gate electrode 105 is transferred to the position under the FG electrode 109 via the p-type impurity layer 129. Thus the MOS capacitance between the FG electrode 109 and the n-type impurity layer 103 is changed, so that the potential of the FG electrode 109 fluctuates. The fluctuating amount of the potential is output to the output signal line 135 by way of the line 123 as an output signal OUT. At that time, there is no operational problem even if the clock signal $\phi_1$ and reset signal $\phi_R$ change to "L" level concurrently. Thereafter, when the clock signal $\phi_1$ and the second clock signal $\phi_2$ change to "H" level, the electric charge $e^-$ under the FG electrode 109 moves to the position under the second transfer gate electrode 113. And when the second clock signal $\phi_2$ changes to "L" level, the electric charge $e^-$ under the second transfer gate electrode 113 is transferred to the next stage CCD, not shown, via the output gate electrode 117. At that time, the output gate electrode 117 is connected to a constant voltage power supply for supplying a given voltage $V_{DC}$ by way of a voltage supply line 131, so that a potential barrier is formed under the output gate electrode 117, thereby preventing the electric charge $e^-$ from moving (flowing backward) from the position under the second transfer gate electrode 113 to the preceding stage CCD.

As described above, since the FG electrode is formed between the p-type impurity layer and the transfer gate electrode having two kinds of channel potential thereunder according to the present invention, it is possible to reduce the parasitic capacitance between the FG electrode and the gate electrode adjacent thereto, and furthermore it is possible to control the transfer (discharge) from the FG electrode and the transfer to the next stage CCD of the electric charge $e^-$ by a transfer gate electrode alone. Accordingly, the present invention can provide a CCD of high sensitivity and high integration.

Furthermore, since impurity layers are formed so as to provide two kinds of channel potential also under other transfer gate electrodes according to the present invention, the electric charge $e^-$ can be transferred with few gate electrodes interposed in the transfer path thereof. Accordingly, it is possible to miniaturize the electric charge transfer portion and moreover increase the degree of integration.

Still furthermore, since the reset signal $\phi_R$ can be applied to the CCD after the second clock signal $\phi_2$ is applied thereto, it is possible to transfer the electric charge $e^-$ stably without allowing the same to flow back.

As described above, the present invention can provide a CCD of high sensitivity and high degree of integration.

While this invention has been described with reference to an illustrative embodiment, this description is not intended to be construed in a limiting sense. Various modifications of the illustrative embodiment, as well as other embodiments of the invention will be apparent to persons skilled in the art upon reference to this description. It is therefore contemplated that the appended claims will cover any such modification or embodiments as fall within the true scope of the invention.

What is claimed is:

1. A charge coupled device comprising:
   a semiconductor substrate having a main surface, including first, second and third regions, both the first and second regions defining the third region therebetween, said semiconductor substrate being formed of a first conductivity type;
   a charge supply formed adjacent to the first region, for supplying an electric charge to the first region;
   a first impurity layer formed of a second conductivity type, formed in the first region, for transferring the electric charge to the third region;
   a floating gate electrode overlying the third region for detecting the electric charge in a first condition and for transferring the electric charge to the second region in a second condition;

a transfer electrode overlying the second region for receiving the electric charge in response to a control signal having a first logic level when the floating gate electrode is in the second condition, the control signal having either the first or a second logic level; and a second impurity layer formed of the first conductivity type formed in the second region adjacent to the third region, wherein said second impurity layer has a first impurity density and the semiconductor substrate has a second impurity density greater than the first impurity density.

2. A charge coupled device comprising:

a semiconductor surface having a main surface and formed of a first conductivity type;

an electric charge path having a first end and a second end formed in the main surface;

a first impurity layer formed of a second conductivity type, formed at the first end of the electric charge path in the main surface, for transferring an electric charge to the electric charge path;

a floating gate electrode overlying the electric charge path for detecting the electric charge in a first condition, and for transferring the electric charge from the one end to the other end of the electric charge path in a second condition;

a second impurity layer formed of the first conductivity type, formed at the second end of the electric charge path in the main surface;

a transfer electrode overlying the second impurity layer and the main surface adjacent to the second impurity layer, for receiving the electric charge in response to a control signal having a first logic level when the floating gate electrode is in the second condition, the control signal having either the first or a second logic level.

3. The charge coupled device according to claim 2, wherein the second impurity layer has a first impurity density and the semiconductor substrate has a second impurity density greater than the first impurity density.

4. A charge coupled device comprising:

a semiconductor substrate having a main surface, further having a first region and a second region in the main surface, said semiconductor substrate being formed of a first conductivity type;

an electric charge path formed in the main surface to electrically connect the first region and the second region;

a first impurity layer formed in the first region of a second conductivity type for providing an electric charge to the electric charge path;

a floating gate electrode overlying the electric charge path for detecting the electric charge in the electric charge path in a first condition and for transferring the electric charge to the second region through the electric charge path in a second condition;

a transfer electrode overlying the second region, for receiving the electric charge in response to a control signal having a first logic level when the floating gate electrode is in the second condition, the control signal having either the first or a second logic level; and a second impurity layer formed of the first conductivity type formed in the second region adjacent to the electric charge path.

5. The charge coupled device according to claim 4, wherein the second impurity layer has a first impurity density and the semiconductor substrate has a second impurity density greater than the first impurity density.

* * * * *